US006851846B2

(12) United States Patent
Fujii et al.

(10) Patent No.: US 6,851,846 B2
(45) Date of Patent: Feb. 8, 2005

(54) MIXING METHOD, MIXING STRUCTURE, MICROMIXER AND MICROCHIP HAVING THE MIXING STRUCTURE

(75) Inventors: Yasuhisa Fujii, Kyoto (JP); Shigeo Yamashita, Sakai (JP); Yasuhiro Sando, Amagasaki (JP); Koji Yamamoto, Kawanishi (JP); Shunichi Hayamizu, Amagasaki (JP)

(73) Assignee: Minolta Co., Ltd., Osaka (JP)

( * ) Notice: Subject to any disclaimer, the term of this patent is extended or adjusted under 35 U.S.C. 154(b) by 181 days.

(21) Appl. No.: 10/171,920

(22) Filed: Jun. 14, 2002

(65) Prior Publication Data

US 2004/0011413 A1 Jan. 22, 2004

(30) Foreign Application Priority Data

Jun. 15, 2001 (JP) ....................................... 2001-182217

(51) Int. Cl.$^{7}$ ........................... B01F 15/02; B01F 5/00; B81B 7/04

(52) U.S. Cl. ............................... 366/173.2; 366/181.6; 366/341

(58) Field of Search ................................ 366/341, 336, 366/337, 340, DIG. 1, DIG. 3, 173.2, 177.1, 181.6; 422/99, 100

(56) References Cited

U.S. PATENT DOCUMENTS 4,793,247 A * 12/1988 Verweij ...................... 366/338
4,983,038 A * 1/1991 Ohki et al. ................. 356/246
5,094,788 A * 3/1992 Schrenk et al. ............. 366/340
5,094,793 A * 3/1992 Schrenk et al. ............. 366/340
5,803,600 A * 9/1998 Schubert et al. ............ 366/144
6,136,272 A * 10/2000 Weigl et al. ............. 422/82.05
6,190,034 B1 * 2/2001 Nielsen et al. .............. 366/336
6,299,657 B1 * 10/2001 Schubert et al. ............ 366/337
6,321,998 B1 * 11/2001 Schubert et al. ............ 366/340

* cited by examiner

*Primary Examiner*—Tony G. Soohoo
(74) *Attorney, Agent, or Firm*—Sidley Austin Brown & Wood LLP

(57) ABSTRACT

Disclosed herewith is a microchip having a micromixer therein. The mixromixer employs a mixing or extracting structure having (1) a first flow pass provided at a first level of the microchip; (2) a second flow pass provided at a second level of the microchip, which is different from the first level; (3) a third flow pass having a plurality of sub flow passes separately layered at the first level and each having a first end and second end thereof, each sub flow pass being connected to one of the first and second flow passes at the first end thereof; and (4) a fourth flow pass, provided at the first level, connected to the second ends of the sub flow passes so that, at least connecting portions between the fourth flow pass and the sub flow passes of the third flow pass, an extending direction of the fourth flow pass is substantially identical to those of the sub flow passes. By allowing the first liquid to flow from the first flow pass to the fourth flow pass through the third flow pass while the second liquid to flow from the second flow pass to the fourth flow pass through the third flow pass, the first and second liquids are mixed at the fourth flow pass.

29 Claims, 10 Drawing Sheets

MIXING METHOD, MIXING STRUCTURE, MICROMIXER AND MICROCHIP HAVING THE MIXING STRUCTURE

CROSS-REFERENCE TO RELATED APPLICATION

This application is based on Japanese Patent Application No. 2001-182217 filed in Japan on Jun. 15, 2001, the entire content of which is hereby incorporated by reference.

BACKGROUND OF THE INVENTION

1. Field of the Invention

The present invention relates to a mixing method, a mixing structure, and a micromixer and a microchip having the mixing structure.

2. Description of the Related Art

A $\mu$-TAS ($\mu$-Total Analysis System) has an exceptionally smaller size than that of a conventionally used appliance, i.e., a flask, a test tube and so on. For this reason, amount, cost and disposal of reagent or specimen can be suppressed, and thus an attention is paid to the $\mu$-TAS as for one feature that synthesizing and detection with a very small amount are possible. The $\mu$-TAS can be applied to a clinical analyzing chip, an environmental analyzing chip, a gene analyzing chip (DNA chip), a sanitary analyzing chip, a chemical/biochemical analyzing chip and the like.

For example, U.S. Pat. No. 5,971,158 discloses an extracting apparatus having a flow pass with a width of about 10 $\mu$m to about 100 $\mu$m. However, it does not disclose a micromixing structure in which a plurality of branched flow passes are arranged three-dimensionally and are interflowed in parallel.

In addition, "The Actualities and Prospects of Microreactor Technique" discloses "LIQUID-SHEET BREAKUP IN MICROMIXERS". This system is constituted so that a liquid and a gas are allowed to flow on the plane from opposite directions and are allowed to interflow so as to be taken out to the top.

In the world of a micro flow pass where a channel has microscale, both the dimension and the flow rate are small, and the Reynolds number is not more than 200. For example, in the case where water is flowed into an average flow pass with a width of 200 $\mu$m to be used in a micro flow pass with a flow rate of 2 mm/s, a Reynolds number becomes 0.4. Therefore, in the world of the micro flow pass (the width of the flow pass is not more than about 500 $\mu$m), a laminar flow is dominant unlike a conventional reacting apparatus in which a turbulent flow is dominant.

In the space of microscale, since a specific interface area is large, the laminar flow is advantageous to diffuse mixing in the interface which comes in contact with the laminar flow. The time required for the mixing depends on a cross-sectional area of the interface where two liquids contact and a thickness of a liquid layer.

According to the diffuse theory, since the time (T) required for the mixing is proportional to $W^2/D$ wherein the width of the flow pass is W and a diffuse coefficient is D, as the width of the flow pass is made to be smaller, the mixing (diffuse) time becomes faster. Moreover, the diffuse coefficient D is obtained by the following equation:

$$D=Kb\times T/6\times\pi\times\mu\times r \tag{1}$$

(Wherein, T: liquid temperature, $\mu$: viscosity, r: particle radius, Kb: Boltzmann's constant)

For example, a relationship between the width of the flow pass (channel width) and the specific interface area and the diffuse time when particles with diameter of 100 nm (0.1 $\mu$m) are used is as shown in FIG. 1.

Namely, in the microscale space, even if mechanical stirring is not used, carrying, reaction and separation of molecules are carried out quickly only by unprompted motion of molecules and particles.

Meanwhile, in a current macroscale apparatus, turbulent mixing according to the mechanical system is generally carried out by using a test tube or the like with diameter of about 5 mm, but the apparent viscosity of a liquid abruptly increases by influences of capillary force and resistance of a flow pass in microscale in comparison with the macroscale, and thus the liquid does not move easily.

For example, In order to compare the mechanical stirring forces required for the mixing in a cylindrical macro flow pass and in a micro flow pass, a model having the following conditions is used:

$$\text{required mechanical stirring force}=\Delta P\times\Delta R \tag{2}$$

(Wherein, ΔP: capillary force, ΔR: resistance of flow pass)

$$\Delta P=H\times\cos\theta\times\tau/A \tag{3}$$

(Wherein, H: surface tension of liquid, θ: contact angle, τ: outer peripheral length of flow pass section, A: cross-sectional area of flow pass)

$$\Delta R=32\times\mu\times L/\pi\times r^4 \tag{4}$$

(Wherein, $\mu$: viscosity, L: length of flow pass (axial height), r: radius of flow pass section)

The required mechanical stirring force in the case where a liquid is in the micro flow pass with inner diameter of 0.2 mm up to the height of 0.1 mm is 488281 times as strong as the required mechanical stirring force in the case where a liquid is in the macro flow pass with inner diameter of 5 mm up to the height of 2 mm. Namely, in order to achieve the equivalent mixing in the microscale apparatus by means of the same mechanical stirring as that in the current macroscale apparatus, the stirring force which is about 100000 times is required in the case of the micro flow pass. This is derived from the above calculation of the model.

Therefore, it is considered that the carrying, reaction and separation of molecules can be carried out by positively using diffusion due to unprompted motion of molecules and particles without using the mechanical stirring in the microscale space.

However, when the width of the flow pass is reduced to an extreme in order to quicken the diffuse time efficiently, the resistance of the flow pass becomes extremely large. As a result, the feeding of the liquid cannot be controlled and also very high pressure is required for feeding the liquid. For this reason, the liquid feeding mechanism is enlarged, and thus a microsystem cannot be established entirely. Moreover, when the width of the flow pass is extremely small, an amount of the liquid is extremely small. As a result, the detection limit is lowered and a higher-sensitive detection mechanism is required, and applications are limited in the current direction method.

SUMMARY OF THE INVENTION

Therefore, a technical problem to be solved by the present invention is to provide a mixing method, a mixing structure, a micromixer and a microchip having the mixing structure which are capable of carrying out diffuse mixing in a microarea efficiently. Hereinafter, "mixing" may include not only mixing a plurality of liquids or fluids but also extracting substances such as particles from a first liquid or fluid to a second liquid or fluid.

In order to solve the above technical problem, a mixing structure having the following structure is provided.

A mixing structure has a first flow pass, a plurality of first branch flow passes, at least one second branch flow pass, a second flow pass and a mixing flow pass. The first branch flow passes are connected to an end portion of the first flow pass and extend to a direction which is the substantially same as the first flow pass, and they are formed into a layer form with substantially parallel intervals. The second branch flow passes are formed into a layer form at least between the first branch flow passes. The second flow passes are arranged on a surface different from a surface including the first branch flow pass and the first branch flow passes and are connected to the second branch flow passes. The mixing flow pass is connected to end portions of the second branch flow passes in a state that the first branch flow passes and the second branch flow passes are roughly overlapped alternately.

In the above structure, for example, a first liquid flows from the first flow pass to the first branch flow passes, and a second liquid flows from the second flow passes to the second branch flow passes, and the first and second liquids interflow in the mixing flow pass. When the first branch flow passes and the second branch flow passes are formed into the layer form, the layered first and second liquids flow in the mixing flow pass alternately so that the first and second liquids can be diffuse-mixed. For example, molecules and particles included in one of the first and second liquids can move to the other due to Brownian movement.

According to the above structure, the layers of the liquids are thinned and a diffuse distance is shortened so that diffuse time is shortened. As a result, the diffuse mixing can be carried out efficiently in a short time. At this time, even if the branch flow passes are thinned into the layer form, its width is set to be large so that a cross-sectional area is acquired and a number of branching is increased so that flow pass resistance in the branch flow passes is prevented from increasing. As a result, a large pump for feeding the liquids can be eliminated. Moreover, a flow rate can be controlled comparatively easily. Therefore, the diffuse mixing can be carried out in a microarea efficiently.

The second branch flow passes formed on the outsides of the first branch flow passes may be included. Moreover, the connected portions between the first and second branch flow passes and the mixing flow pass may be overlapped completely or separated slightly. Further, since the second flow passes are arranged on the surface different from the first flow pass and the first branch flow passes and are constituted three-dimensionally, not only two liquid but also three or more liquids can be allowed to interflow simultaneously. For example, the first flow pass and the first branch flow passes through which the first liquid flows are formed on a plane, and two or more liquids flow from upper and/or lower sides so that the three or more liquids can be allowed to interflow simultaneously.

Preferably, a valve section where a flow pass cross-sectional area vertical to a flowing direction is enlarged when viewed in the flowing direction from the second flow pass to the second branch flow pass is provided on the connected portion of the second flow pass and the second branch flow pass or on their vicinity portion.

In the above structure, when the liquid which has flowed through the second flow passes reach the connected portion of the second flow pass and the second branch flow pass or the vicinity portion, since the flow pass cross-sectional area becomes large, when a pressure has a value not more than a predetermined value, meniscuses of the liquids can be stopped in the connected portion or the vicinity portion. Moreover, the pressure which exceeds the predetermined value is applied to the liquids, so that the liquids pass through the connected portion or the vicinity portion and can be flowed from the second branch flow pass into the mixing flow pass. Such a valve function enables the liquids to interflow at suitable timing. Therefore, the liquids can be led to the mixing flow pass easily with a predetermined ratio. Moreover, a number of foams to be mixed can be comparatively less.

Preferably, the mixing flow pass includes a section reduced portion. As the section reduced portion is separated farther from the end portions, the dimension of the flow pass section in a direction corresponding to the interval direction of the first and second branch flow passes (for example, the mixing flow pass is curved, it is the direction being right angles with the flow passes) becomes smaller.

According to the above structure, after the plural liquids are led to the mixing flow pass with a predetermined ratio, the flow pass is gradually narrowed, so that the layers of the plural liquids are thinned with the predetermined ratio being maintained and thus the diffuse distance is shortened. As a result, the mixing time can be shortened.

Preferably, the first and second branch flow passes have a dimension in the interval direction of not more than 200 μm.

When a thickness of each layer of the liquids in the mixing flow pass is 200 μm, the liquids can be mixed for the time equivalent to the time required for mechanical stirring. In order to mix the liquids with efficiency equivalent to or higher than the mechanical stirring, the thickness is preferably not more than 200 μm.

As the thickness of each layer of the liquids is made to be smaller, the diffusion becomes faster, but when the thickness is made to be too small, the flow pass resistance increases. As a result, processing and reactive detection are difficult, and thus entire miniaturization and efficiency including a liquid feed mechanism, a detection mechanism and the like cannot be improved. Therefore, it is practical that the thickness of each layer of the liquids is not less than 10 μm (preferably not less than 20 μm) to not more than 50 μm.

Preferably, as for the first and second branch flow passes, the dimension in the alternating direction of the first and second branch flow passes on the center is smaller than the dimension on the outside.

In general, in the case where the liquids are fed by a pressure generated by mechanical means such as a pump, as the flow pass width is narrower, the feeding is easily influenced by flow pass walls, and thus distribution of the speed is generated in the flow pass widthwise direction. More concretely, a flow rate on the center is higher than that in the vicinity of the flow pass walls. In the mixing flow pass, as the flow rate is slower, the mixing time becomes longer so that the mixing is easily progressed, and the mixing is finished with a short distance. Therefore, when the branch flow pass width is changed like the above structure, the flow rates of the respective layers after flowing into the mixing pass become approximately equal, so that the diffuse mixing can be progressed efficiently and uniformly.

Preferably, as for the first and second branch flow passes and the mixing flow pass, at least the vicinity portions of their connected portions extend to the substantially uniform direction.

When disturbance and deflection occurs at the time of interflow of the liquids in the mixing flow pass, the diffuse distance becomes partially long so that an area where the mixing is incomplete is generated and foams are generated. However, according to the above structure, when the liquids are allowed to interflow in the mixing flow pass, disturbance and deflection can be prevented. For this reason, the diffuse distance can be prevised sufficiently, and the liquids can be mixed uniformly. Namely, the liquids can be mixed efficiently.

In addition, in order to solve the above technical problem, the present invention provides a mixing structure having the following structure.

The mixing structure has a plurality of first branch flow passes formed into a layer form, a plurality of second branch flow passes which are formed into a layer form on a plurality of layer levels different from layer levels including the first branch flow passes, and a mixing flow pass having an end portion connected to end portions of the first and second branch flow passes.

According to the above structure, a first liquid which flows through the first branch flow passes and a second liquid which flows through the second branch flow passes flow in the mixing flow pass with being overlapped with one another in the layer form. At this time, diffusion can be progressed to a thicknesswise direction of the layers.

According to the above structure, even if depths of the first and second branch flow passes, namely, dimensions of the first and second branch flow passes in the interval direction are set to be small, the dimension in the right angle direction is set to be larger than the depth, so that a decrease in the flow pass cross-sectional area can be prevented and an increase in the flow pass resistance can be suppressed. Moreover, since the first and second branch flow passes are shallow and an aspect ratio can be set to be lower, the mixing structure can be manufactured easily by using glass, resin or the like other than silicon.

Preferably, the mixing flow pass includes a section reduced portion where a flow pass sectional dimension in the same direction as the layered of the first and second branch flow passes becomes smaller as being separated farther from the end portions.

According to the above structure, after a plurality of liquids are led to the mixing flow pass with the predetermined ratio, the flow pass is narrowed gradually, so that the layers are thinned with the plural liquids maintaining the predetermined ratio and the diffuse distance is shortened. As a result, the mixing time can be shortened.

Preferably, as for the first and second branch flow passes and the mixing flow pass extend, at least the vicinity portions of their connected portions extend to the substantially uniform direction.

When disturbance and deflection occurs at the time of interflow of the liquids in the mixing flow pass, the diffuse distance becomes partially long so that an area where the mixing is incomplete is generated and foams are generated. However, according to the above structure, when the liquids are allowed to interflow in the mixing flow pass, disturbance and deflection can be prevented. For this reason, the diffuse distance can be prevised sufficiently, and the liquids can be mixed uniformly. Namely, the liquids can be mixed efficiently.

Further, in order to solve the above technical problem, the present invention provides a micromixer having the mixing structure with each of the above structures.

In addition, in order to solve the above technical problem, the present invention provides a microchip having the mixing structure with each of the above structures.

Further, in order to solve the above technical problem, the present invention provides the following mixing method.

The mixing method includes the first step of branching a first liquid into plural layers so as to be substantially parallel with one another with intervals and flowing the liquids, the second step of flowing a second liquid onto a surface different from a surface including a flow pass for the first liquid and flowing the second liquid in a layer form between the layers of the first liquid, and the third step of interflowing the layered first and second fluids in a laminar state.

According to the above method, after the first and second liquids interflow, diffuse mixing can be carried out between the layers of the first and second liquids. For example, molecules and particles included in one of the first and second liquids can move to the other due to Brownian movement.

According to the above method, the layers of the liquids are thinned and a diffuse distance is shortened so that diffuse time is shortened. As a result, the diffuse mixing can be carried out in a short time efficiently. At this time, even if the layers of the liquids are thinned, their widths are set to be large so that sectional areas are acquired and a number of layers is increased so that flow pass resistance is prevented from increasing. As a result, a large pump for feeding the liquids can be eliminated. Moreover, a flow rate can be controlled comparatively easily.

Therefore, the diffuse mixing can be carried out in a microarea efficiently.

In addition, not only the two liquids but also three liquids can be allowed to interflow simultaneously.

Preferably, at least one of the first and second steps includes the flow stopping step of flowing the first or second liquid to a predetermined position before the interflow and temporarily stopping the flow, and the flow restarting step of flowing the stopped first or second liquid from the predetermined position at predetermined timing.

The flow stopping step and the flow restarting step enable the liquids to interflow at suitable timing. Therefore, the liquids can be mixed easily with a predetermined ratio. Moreover, a number of foams to be mixed is comparatively less.

Preferably, the method further includes the fourth step of making a flow pass dimension in a direction corresponding to a direction where the interflowed first and second liquids are overlapped (in the case where the flow pass is curved, it is a direction being at right angles with the flow pass) to be smaller towards a lower stream side.

At the fourth step, since the flow pass of the liquids interflowed with the predetermined ratio is narrowed gradually, the respective layers are thinned in a state that the predetermined ratio is maintained, and the diffuse distance between the layers is shortened so that the mixing time can be shortened.

Preferably, at the third step, the respective layers of the first and second liquids are allowed to interflow in a state that a dimension in the overlapped direction is not more than 200 $\mu$m.

When the thicknesses of the layers of the liquids are not more than 200 $\mu$m, the liquids can be mixed for a shorter time that mechanical stirring.

As the thickness of each layer of the liquids is made to be smaller, the diffusion becomes faster, but when the thickness is made to be too small, the flow pass resistance increases. As a result, processing and reactive detection are difficult, and thus entire miniaturization and efficiency including a liquid feed mechanism, a detection mechanism and the like cannot be improved. Therefore, it is practical that the thickness of each layer of the liquids is not less than 10 μm (preferably not less than 20 μm) to not more than 50 μm.

Preferably, at the first and second steps, the dimension of each layer of the first and second liquids in the overlapped direction is smaller at the center of the overlapped direction than on the outside.

In general, in the case where the liquids are fed by a pressure generated by mechanical means such as a pump, as the flow pass width is narrower, the feeding is easily influenced by flow pass walls, and thus distribution of the speed is generated in the flow pass widthwise direction. More concretely, a flow rate on the center is higher than that in the vicinity of the flow pass walls. In the mixing flow pass, as the flow rate is slower, the mixing time becomes longer so that the mixing is easily progressed, and the mixing is finished with a short distance. Therefore, when the thickness of each layer of the liquids before the interflow is changed as mentioned above, the flow rates of the respective layers become approximately equal, so that the diffuse mixing can be progressed efficiently and uniformly.

Preferably at the third step, the respective layers of the first and second liquids are flowed in the substantially uniform direction and are interflowed.

According to the above method, since the liquids can be allowed to interflow so that disturbance and deflection do not occur, the diffuse distance can be prevised, and the liquids can be mixed uniformly. Namely, the diffuse mixing can be carried out efficiently.

Preferably at the third step, the layers of the first and second liquids are allowed to interflow at a flow rate which becomes the substantially same as a flow rate after the interflow.

According to the above method, the least relative difference in the flow rates between the layers after the interflow is allowed, so that the mixing can be carried out more efficiently.

In addition, in order to solve the technical problem, the present invention provides the following mixing method.

The mixing method includes the first step of flowing a first liquid in a layer form, the second step of flowing a second liquid in a layer form, and the third step of interflowing the layered first and second liquids with them being overlapped with one another.

According to the above method, the first and second liquids flow with them being overlapped in the layer form, and at this time the diffuse mixing can be progressed in a thicknesswise direction of the layers. According to the above method, even if the layers are thinned, their widths are enlarged so that an increase of flow pass resistance can be small. Flow passes for flowing the fluids can be manufactured easily by using glass, resin or the like other than silicon.

Preferably, the method further includes the fourth step of making a flow pass dimension in the direction where the interflowed first and second liquids are overlapped to be smaller towards a lower stream side.

According to the above method, since the flow pass is gradually narrowed after the liquids are allowed to interflow with a predetermined ratio, the diffuse distance between the layers becomes shorter in the state that the predetermined ratio is maintained, so that the mixing time can be shortened.

Preferably at the third step, the layers of the first and second liquids are flowed to a substantially uniform direction and are allowed to interflow.

According to the above method, since the liquids can be allowed to interflow so that disturbance and deflection do not occur, the diffuse distance can be prevised sufficiently, and the liquids can be mixed uniformly. Namely, the diffuse mixing can be carried out efficiently.

Preferably at the third step, the layers of the first and second liquids are allowed to interflow at the flow rate which becomes the substantially same as the flow rate after the interflow.

According to the above method, the least relative difference in the flow rates between the layers after the interflow is allowed so that the mixing can be carried out more efficiently.

Further more, to solve the above mentioned technical problems, a flow pass structure reflecting one aspect of the present invention comprises: a first flow pass provided at a first level of the flow pass structure; a second flow pass provided at a second level of the flow pass structure, the second level being different from the first level; a third flow pass having a plurality of sub flow passes separately layered and each having a first end and second end thereof, each sub flow pass being connected to one of the first and second flow passes at the first end thereof; and a fourth flow pass connected to the second ends of the sub flow passes.

In the flow pass structure mentioned above, if a first liquid flows from the first flow pass to the fourth flow pass through the third flow pass and a second liquid flows from the first flow pass to the fourth flow pass through the third flow pass, the flow pass structure can be used as a mixing flow pass structure for mixing the first and second liquids. On the other hand, if a first liquid flows from the fourth flow pass to the first flow pass through the third flow pass and a second liquid flows from the fourth flow pass to the second flow pass through the third flow pass, the flow pass structure can be used as a separating flow pass structure for separating the first and second liquids.

The third and fourth flow passes may be provided at the first level. In this case, the connection among the first flow pass, the second flow pass, and the fourth flow pass is drastically simplified, and therefore, the whole structure is also simplified. It is possible to simultaneously form the first, third and fourth flow passes by, for instance, an etching process since they are to be provided at a same level. Further, in the second level, one end of the second flow pass may be provided at a position where the first ends of the sub flow passes are provided in the first level. In this case, connection between one(s) of the sub flow pass and the second flow pass is achieved by simply forming through hole between the first and second levels.

BRIEF DESCRIPTION OF THE DRAWINGS

These and other objects, advantages and features of the invention will become apparent from the following description thereof taken in conjunction with the accompanying drawings in which.

DESCRIPTION OF THE PREFERRED EMBODIMENTS

There will be explained below preferred embodiments of the present invention with reference to FIGS. 2 to 11.

Firstly, there will be explained below a first embodiment of the present invention with reference to FIGS. 2 to 10. FIGS. 2 to 10 show embodiments of a microchip 2 to be used for testing blood coagulation.

Figure 1:
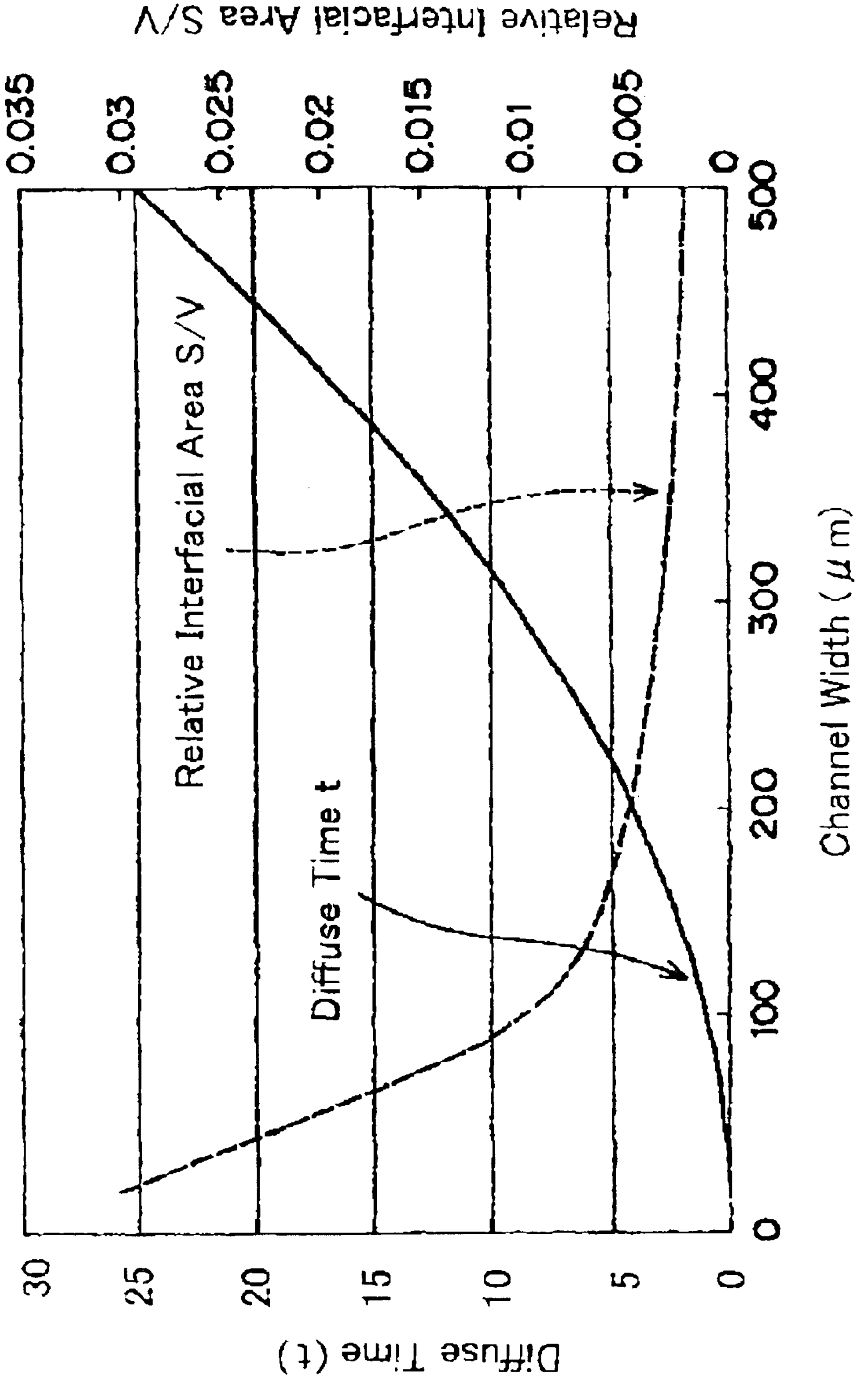
FIG. 1 is a diagram showing a relationship between a width of a flow pass, diffuse time and a specific interface area.
Figure 2:
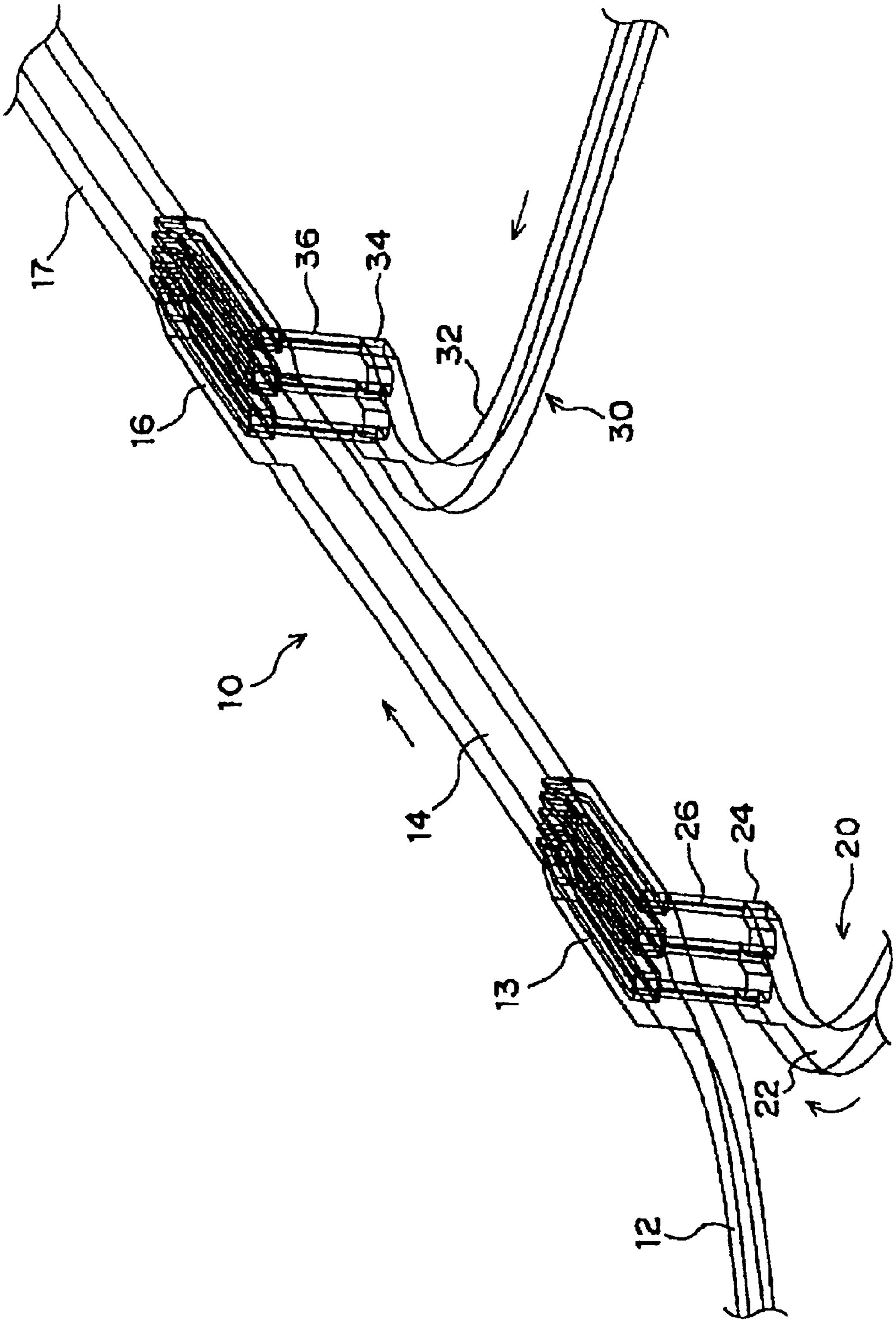
FIG. 2 is a perspective drawing showing a flow pass structure of a microchip according to a first embodiment of the present invention.

As shown in FIG. 2, in the microchip 2, three flow pass sections 10, 20 and 30 are constituted three-dimensionally. Connection flow passes 26 and 36 which are connected to the second flow pass section 20 and the third flow pass section 30 respectively interflow with first and second interflow sections 13 and 16 from the bottom. The first and second interflow sections 13 and 16 are provided in the middle of the first flow pass section 10 through which a specimen (blood) is flowed. A diluent is flowed through the second flow pass section 20. A reagent is flowed through the third flow pass section 30. The respective liquids are mixed in first and second mixing flow passes 14 and 17 on the lower stream side. An end of a lower portion 22 of the second flow pass section 20 is branched into three, and the three ends are connected respectively to the connection flow passes 26. An end 34 of a lower portion 32 of the third flow pass section 30 is branched into three, and the three ends are connected respectively to the connection flow passes 36.

For example, the first flow pass section 10 has a depth (vertical dimension in FIG. 2) of about 100 μm. The width (a horizontal dimension in FIG. 2) is about 150 μm on the upper stream side flow pass 12, and about 300 μm in the mixing flow passes 14 and 17.

Figure 3:
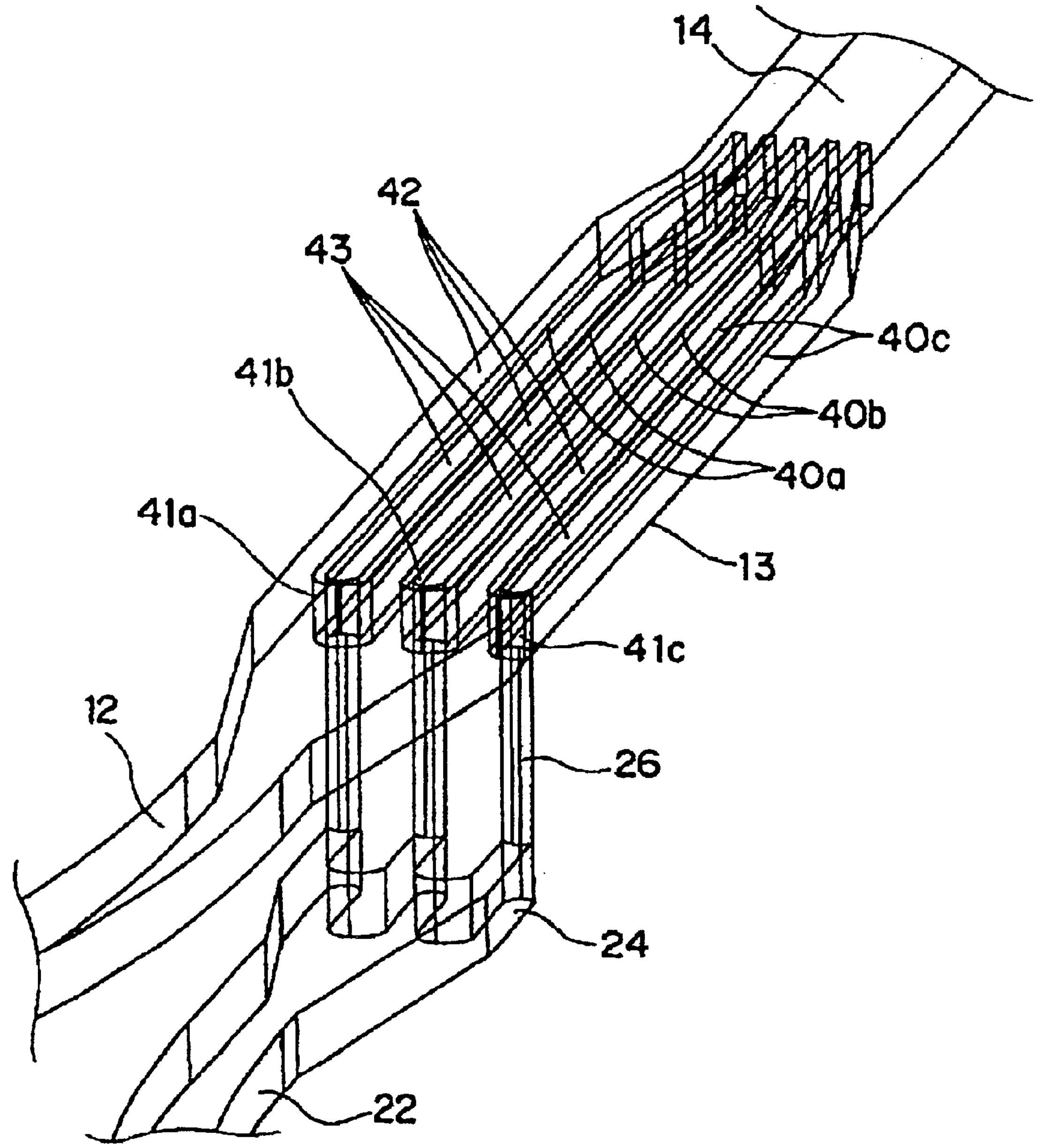
FIG. 3 is an enlarged perspective drawing of a main section in FIG. 2.

As shown in the enlarged perspective view of the main section in FIG. 3, in the first interflow section 13, three first branch flow passes 42 through which the specimen (blood) flows and three second branch flow passes 43 through which the diluent flows are arranged alternately. Moreover, the respective liquids in the laminar form are diffusion-mixed in the first mixing flow pass 14 on the lower stream side of the first interflow section 13.

In order to form the branch flow passes 42 and 43, three pairs of partition walls 40*a*, 40*b* and 40*c* of which upper stream sides are connected respectively to connection walls 41*a*, 41*b* and 41*c* are arranged on the first interflow section 13. The partition walls 40*a*, 40*b* and 40*c* have thickness of several μm and they are arranged with intervals so as to be approximately parallel with the flow pass direction. The first branch flow passes 42 are formed between the respective pairs of the partition walls 40*a*, 40*b* and 40*c*, and the specimen (blood) flows from the upper stream side flow pass 12 of the first flow pass section 10. The second branch flow passes 43 are formed so as to have U-shaped sections by the partition walls 40*a*, 40*b* and 40*c* and the connection walls 41*a*, 41*b* and 41*c*. The connection flow passes 26 are connected respectively to the upper stream sides of the branch flow passes 43, and the diluent flows therein.

The lower stream sides of the branch flow passes 42 and 43 extend parallel with the mixing flow pass 14 so that the least disturbance and deflection are caused in the interflowed liquid. As a result, the liquids are mixed as uniform as possible.

The partition walls 40*a*, 40*b* and 40*c* may be arranged with uniform intervals or suitably various intervals. For example, the center side may be narrower than the outer side in the interval direction so that the flow rate on the outer sides of the flow passes 42 and 43 is higher than that on the center. As a result, the flow rate in the vicinity of the flow pass wall in the mixing flow pass 14 is prevented from being low, and the flow rates of the liquids flowing out of the flow passes 42 and 43 become approximately equal with one another so that the liquids can be mixed more uniformly.

Next, there will be explained below the manufacturing steps of the microchip 2 with reference to FIGS. 5(*a*) through 5(*j*).

Firstly, oxide films 52 and 54 are formed on upper and lower surfaces of a silicon substrate 50 (see FIG. 5(*a*)). A silicon wafer with a thickness of 400 μm, for example, is used for the silicon substrate 50. The oxide films 52 and 54 are deposited by thermal oxidation so that their thicknesses become 1.5 μm, for example.

Next, a resist is applied to the upper surface, and a predetermined mask pattern is exposed to be developed. Thereafter, the oxide film 52 on the upper surface is etched. A resist on the upper surface is peeled (see FIG. 5(*b*)). As shown by reference numerals 52*a* and 52*b*, the oxide film 52 is completely removed by its thickness. OFPR 800, for example, is used for the application of the resist, and a thickness of the resist film is 1 μm, for example (this is applied to the following ones). RIE, for example, is used for the removal of the oxide film 52 (this is applied to the following ones). Sulfuric acid peroxide, for example, is used for the peeling of the resist (this is applied to the following ones).

Next, the resist is again applied to the upper surface and is exposed to be developed, and the oxide film 52 is etched into a stepped shape. The resist on the upper surface is peeled (see FIG. 5(*c*)). As a result, as shown by the reference numeral 52*c*, the oxide film 52 is removed partway in the thicknesswise direction. For example, the oxide film 52 is removed only by the thickness of 0.8 μm.

Next, the resist is applied to the lower surface and is exposed to be developed, and after the oxide film 54 is etched, the resist is peeled (see FIG. 5(*d*)). As a result, as shown by the reference numeral 54*a*, the oxide film 54 is removed completely in the thicknesswise direction according to the mask pattern.

Next, silicon etching is carried out on the upper surface, and through hole sections 50*a* and 50*b* of the silicon substrate 50 are removed partway (see FIG. 5(*e*)). ICP (Inductively Coupled Plasma), for example, is used for the silicon etching (this is applied to the following ones).

The oxide film 52 on the upper surface is etched so that a stepped thin section 52*c* is removed completely (see FIG. 5(*i*)). Further, silicon etching is carried out also on the upper surface so that the through hole sections 50*a* and 50*b* are removed more deeply, and an upper side flow pass 51*a* is formed (see FIG. 5(*g*)).

Next, silicon etching is carried out on the lower surface so that the through hole sections 50*a* and 50*b* are bored, and a lower side flow pass 51*b* is formed (see FIG. 5(*h*)).

The oxide films 52 and 54 on the upper and lower surfaces are peeled so as to be removed completely (see FIG. 5(*i*)). BHF is used for peeling the oxide films 52 and 54.

Glass covers 56 and 58 are stuck to both the surfaces of the silicon substrate 50 (see FIG. 5(*j*)). Anode junction is carried out with 900 V and at 400° C., for example.

Figure 6A:
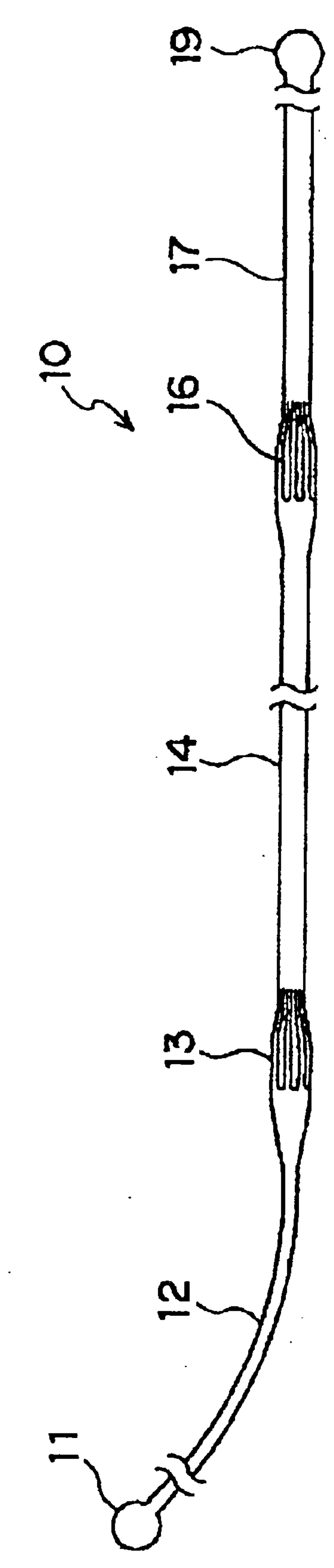
FIG. 6(*a*) is a top view showing a upper side flow pass of the microchip and FIG. 6(*b*) is a modification thereof.
Figure 6B:
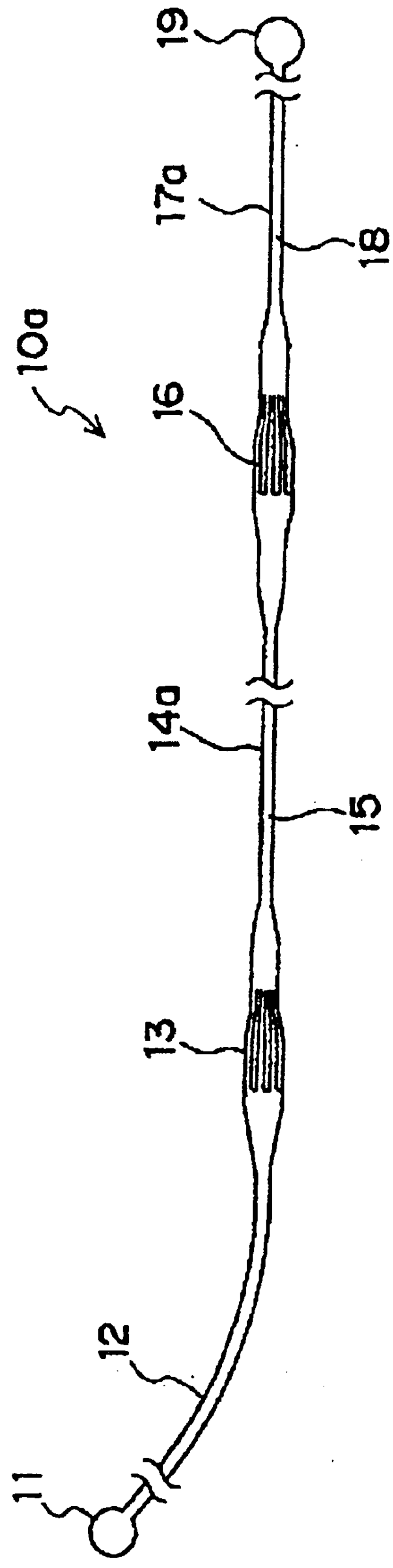

As shown in the top view of FIGS. 6(*a*) and 6(*b*), the first flow pass section 10 is formed as the upper side flow pass 51*a*. Openings 11 and 19 are formed respectively at both ends of the first flow pass section 10 so that the specimen can be supplied and waste liquor can be discharged.

As shown in FIG. 6(*a*), the widths (dimension in the direction being at right angles to the flow passes in the drawing) of the first and second mixing flow passes 14 and 17 may be constant. Moreover, as shown in FIG. 6(*b*), section reduced portions 15 and 18 of which widths are narrow may be provided respectively in the middle of the first and second mixing flow passes 14*a* and 7*a*. In the latter case, each layer of the liquids becomes thin in the section reduced portions 15 and 18 so that the mixing is accelerated more than the former case. For example, even if coagulation or the like occurs partially on the interface, since the interface is widened, the liquids can be mixed uniformly. The flow pass width is set to be narrower by the half width, for example.

Figure 7A:
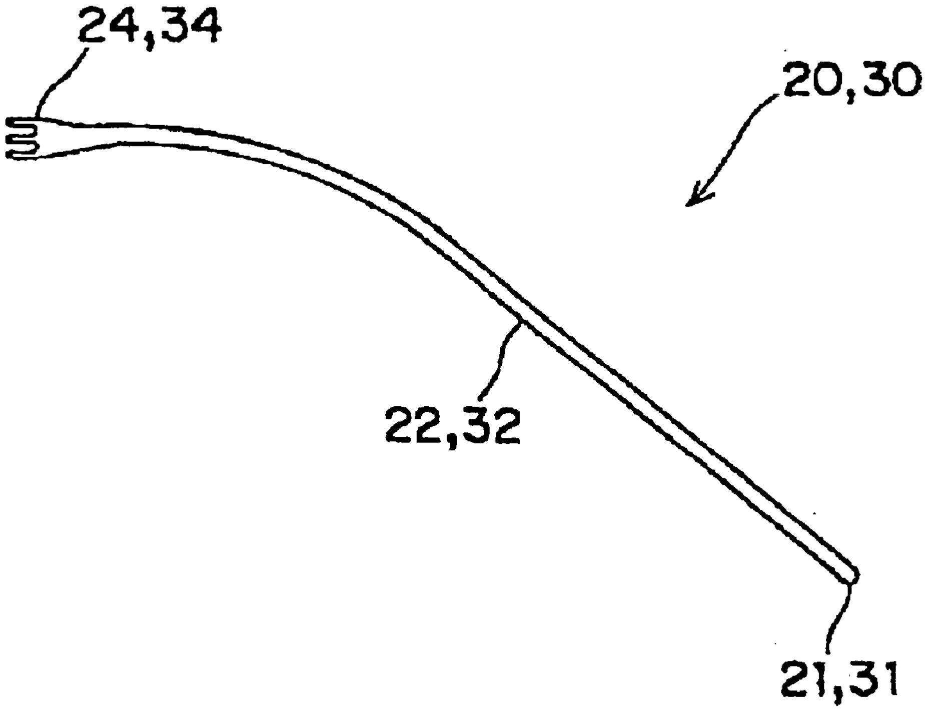
FIG. 7(*a*) is a bottom view showing a lower side flow pass of the microchip and FIG. 7(*b*) is an enlarged view of the lower side flow pass.
Figure 7B:
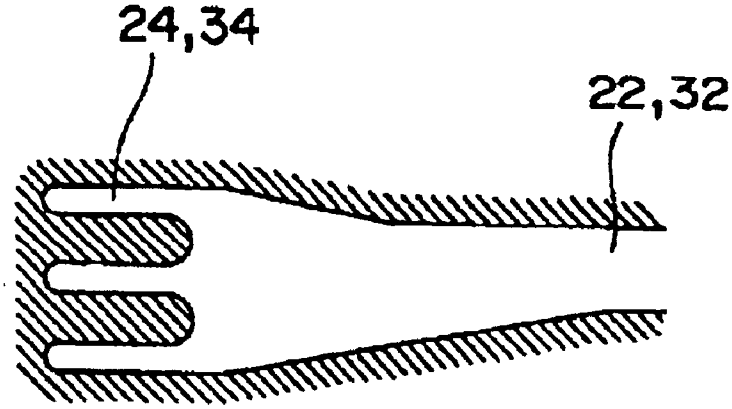

As shown in the bottom view of FIG. 7(*a*), the second and third flow pass sections 20 and 30 are formed as the lower side flow pass 51*b*. The lower side flow pass 51*b*, namely, the second and third flow pass sections 20 and 30 are curved to the upper side flow flow pass 51*a*, namely to the opposite direction to the upper stream side flow pass 12 of the first flow pass section 10 so that the end portions 24 and 34 are branched into three as mentioned above. The other ends 21 and 31 of the second and third flow pass sections 20 and 30 are pierced up to the upper surface of the silicon substrate 50 so that diluent and the reagent can be supplied.

Figure 8:
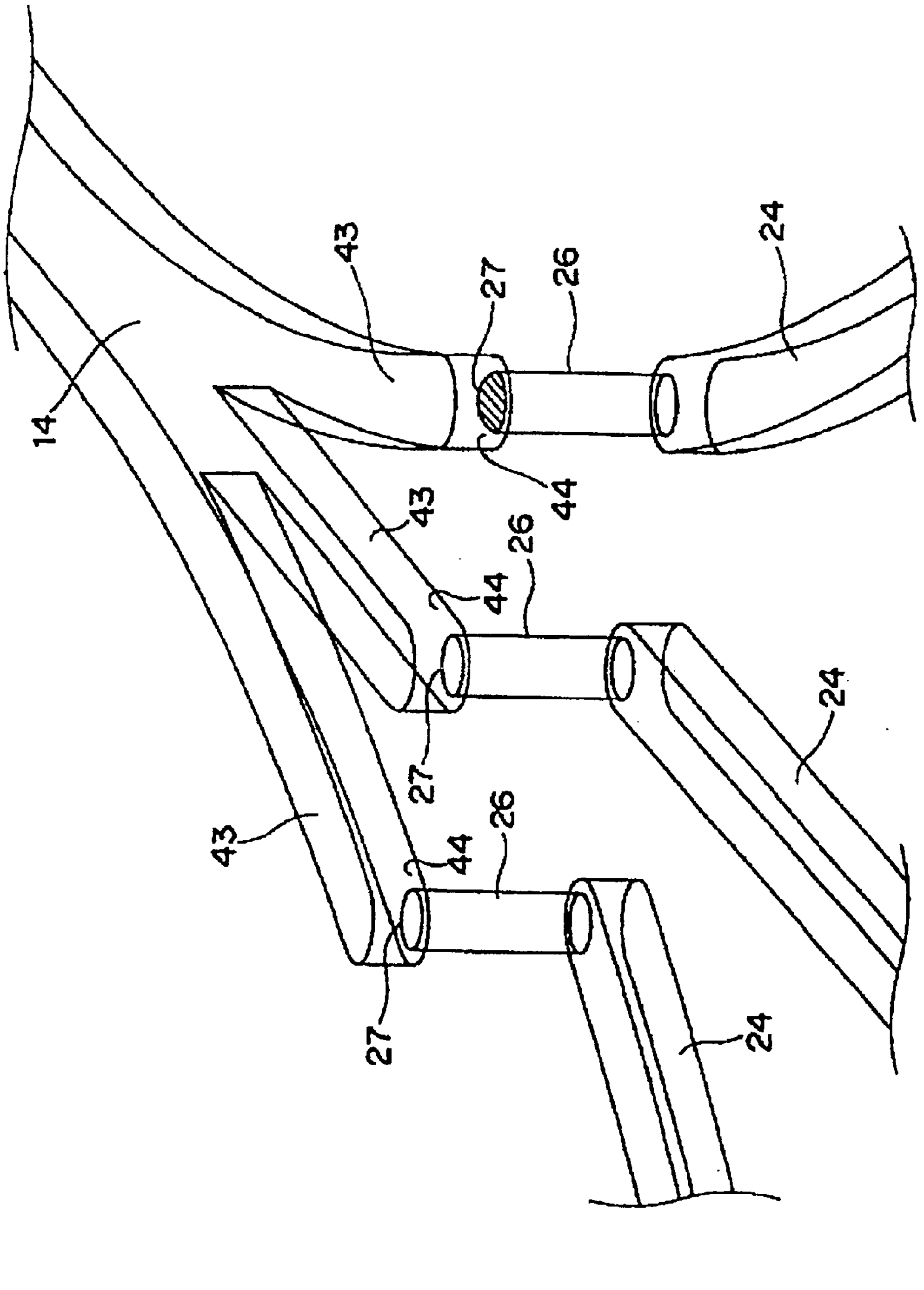
FIG. 8 is an explanatory diagram of a valve.

As shown in the perspective view of FIG. 8, for example, the upper side flow pass 51*a* and the lower side flow pass 51*b* are connected via the connection flow pass 26.

An opening 27 which is an end portion of the connection flow pass 26 is formed on a lower surface 44 of the branch flow pass 43.

When the liquid passes through the connection flow passes 26 so as to reach the openings 27, since the flow pass cross-sectional area becomes large, a meniscus of the fluid can be stopped at the openings 27. When the inner surfaces of the connection flow passes 26 and the lower surfaces 44 of the branch flow passes 43 have wetting and water repellency, the meniscus of the fluid remains at the openings under a predetermined pressure (hereinafter, referred to as "stopping force"). When the pressure exceeds the stopping force, the fluid flows into the branch flow passes 43 from the openings 27.

Figure 9:
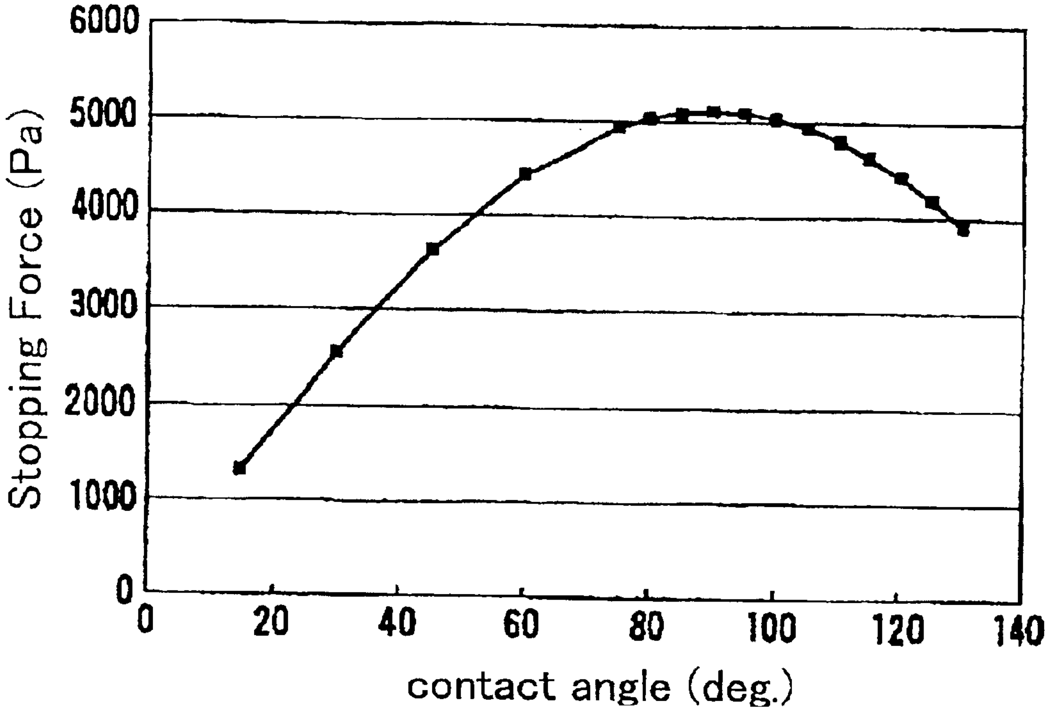
FIG. 9 is a diagram showing a relationship between a stopping force and a contact angle.
Figure 10:
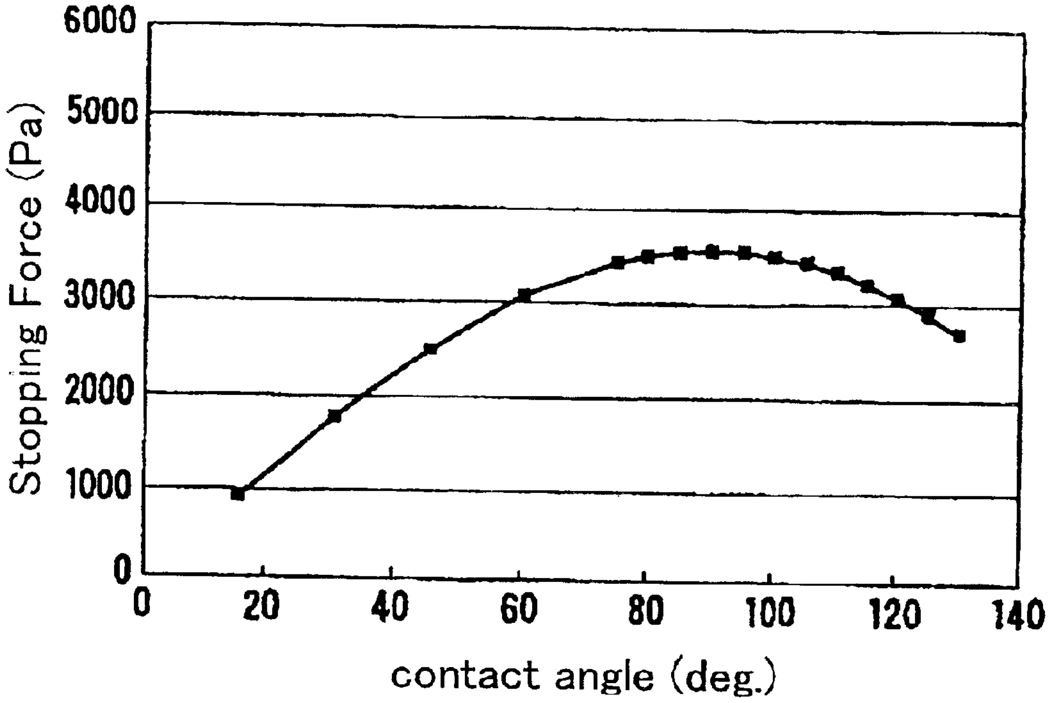
FIG. 10 is a diagram showing a relationship between the stopping force and the contact angle.

FIGS. 9 and 10 are graphs showing a relationship between the stopping force and a contact angle of the meniscus of the fluid. FIG. 9 shows the case where the width of the flow pass section is 40 $\mu$m and the height is 100 $\mu$m. FIG. 10 shows the case where the width of the flow pass section is 70 $\mu$m and the height is 100 $\mu$m.

When such a portion having a valve function (valve section) is provided, the liquid can be fed at predetermined timing. Therefore, a mixing ratio of the liquids can be controlled accurately.

Even if the flow pass cross-sectional area is not changed discontinuously, the valve function can be provided. Moreover, also in the case of the specimen (blood), for example, the portion having the valve function may be provided in the middle of the upper stream side flow pass 12.

Figure 4:
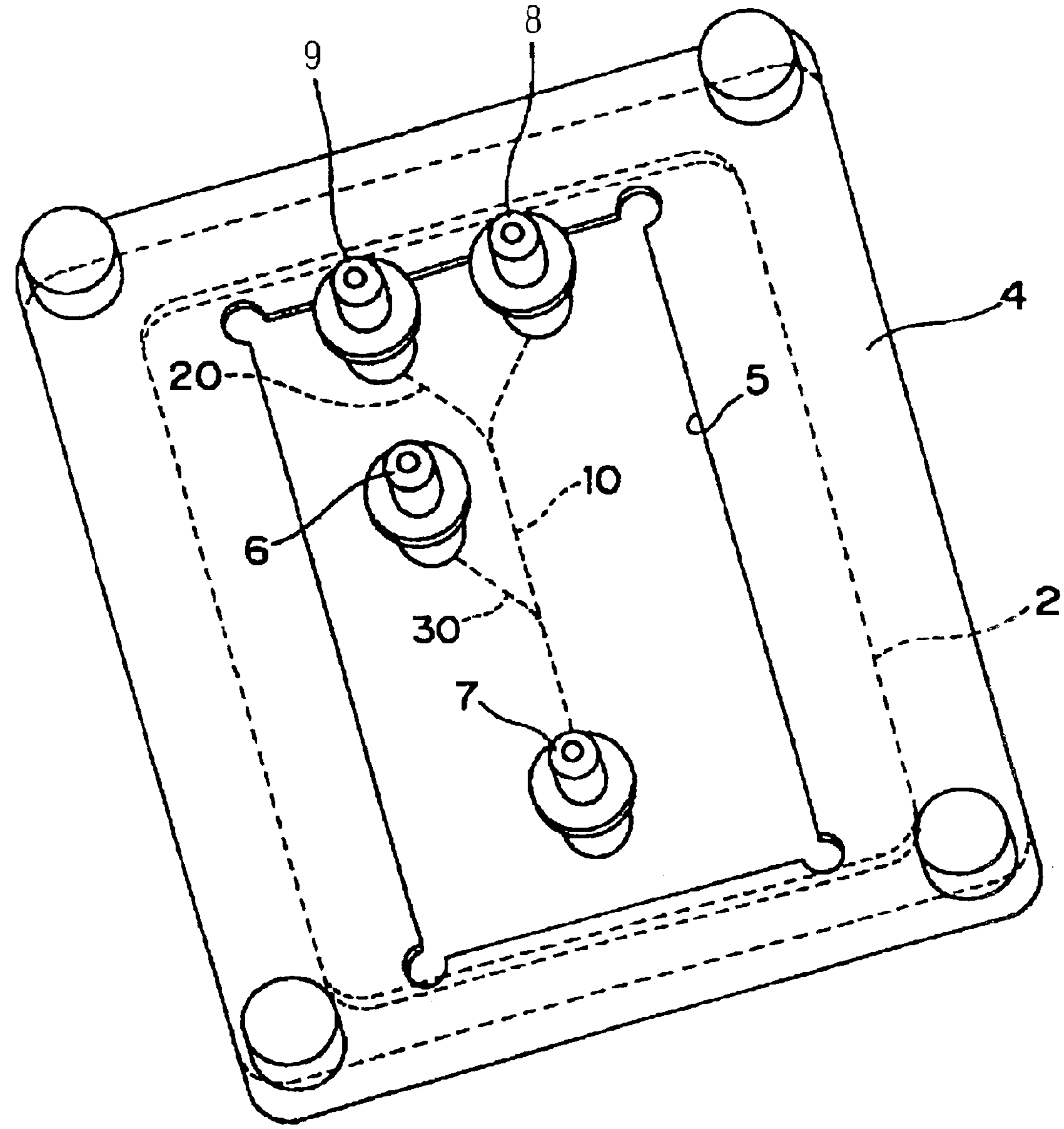
FIG. 4 is a perspective view showing a use state of the microchip.
Figure 5A:
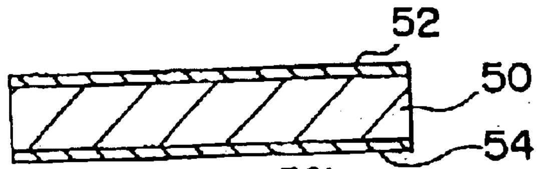
FIGS. 5(*a*) through 5(*j*) are explanatory diagrams of the manufacturing steps of the microchip.
Figure 5B:
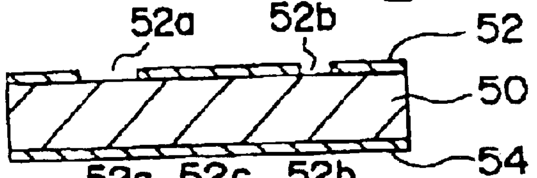
Figure 5C:
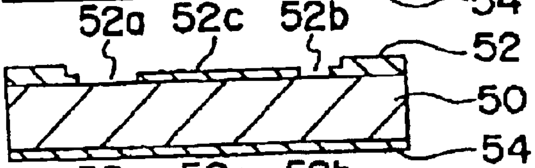
Figure 5D:
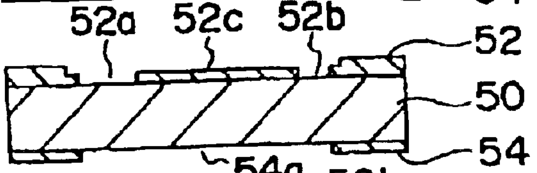
Figure 5E:
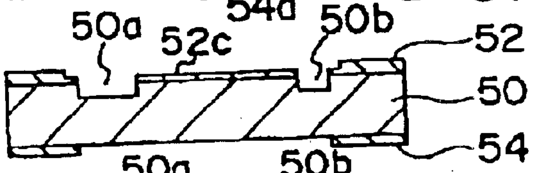
Figure 5F:
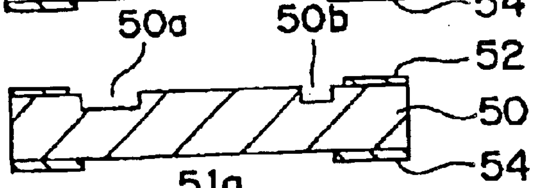
Figure 5G:
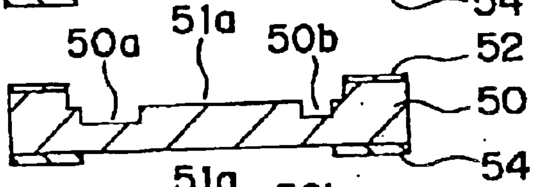
Figure 5H:
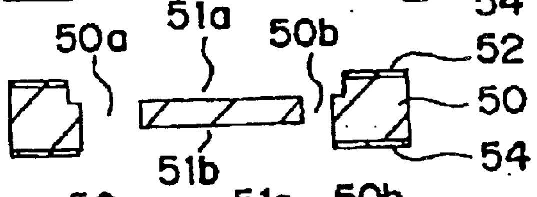
Figure 5I:
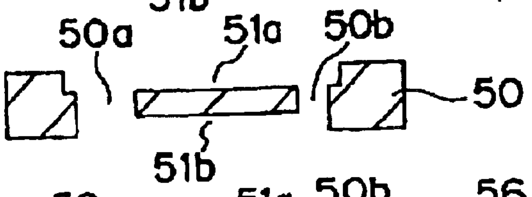
Figure 5J:
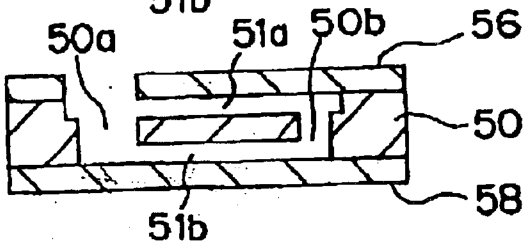

FIG. 4 is a perspective view showing an use example of the microchip 2. The microchip 2 is held at its upper and lower parts by a holder 4. Openings 5 are formed in the holder 4 so that the liquid is injected or discharged from caps 4 to 7 connected to the microchip 2. In the case of the test for blood coagulation, the specimen (blood) is injected from the cap 8, the diluent is injected from the cap 9, and the reagent is injected from the cap 6, and waste liquor is collected from the cap 7.

There will be explained below a second embodiment of the present invention with reference to FIG. 11.

As for a microchip 3, three flow pass sections 62, 64 and 66 are formed on a substrate 60. The first and second flow pass sections 62 and 64 interflow with the third flow pass section 66 in the substrate 60. Openings 62*a* and 66*a* which are one ends of the first and third flow pass sections 62 and 66 are formed on the upper surface of the substrate 60. An opening 64*a* which is one end of the second flow pass section 64 is formed on the lower surface of the substrate 60. Two liquids supplied from the openings 62*a* and 64*a* interflow in the third flow pass section 66 and are discharged from the opening 66*a*.

The respective flow pass sections 62, 64 and 66 extend to the approximately same direction in a vicinity portion of the joint portion of the flow pass sections 62, 64 and 66 so that the least disturbance and deflection occur in the liquids when the liquids interflow. Dimensions of the flow pass sections 62, 64 and 66 in the depthwise direction (dimensions in the vertical direction in FIG. 11(*a*)) are set to be relatively small in the vicinity portion of the joint portion so that the two liquids can be mixed for a short time by utilizing diffuse mixing similarly to the first embodiment. On the other hand, dimensions of the flow pass sections 62, 64 and 66 in the widthwise direction (dimensions in the direction being right angles with the sheet surface in FIG. 11(*a*)) are set to be relatively large so that the flow pass resistance can be prevented from becoming too large.

Figure 11A:
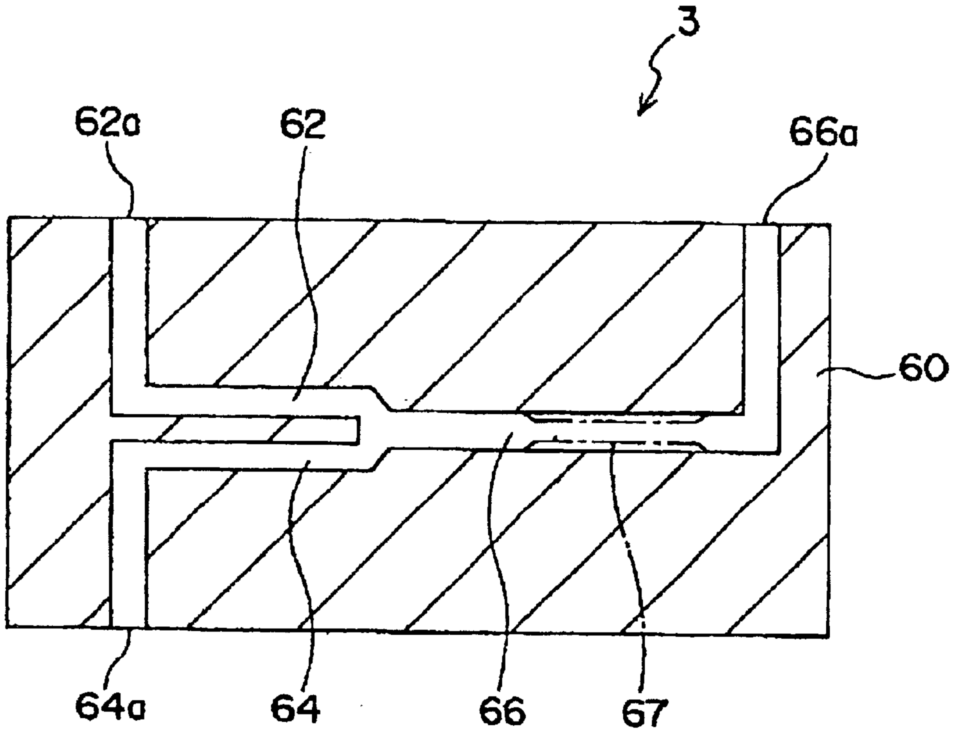
FIGS. 11(*a*) and 11(*b*) are typical structural diagrams of the microchips according to a second embodiment of the present invention.
Figure 11B:
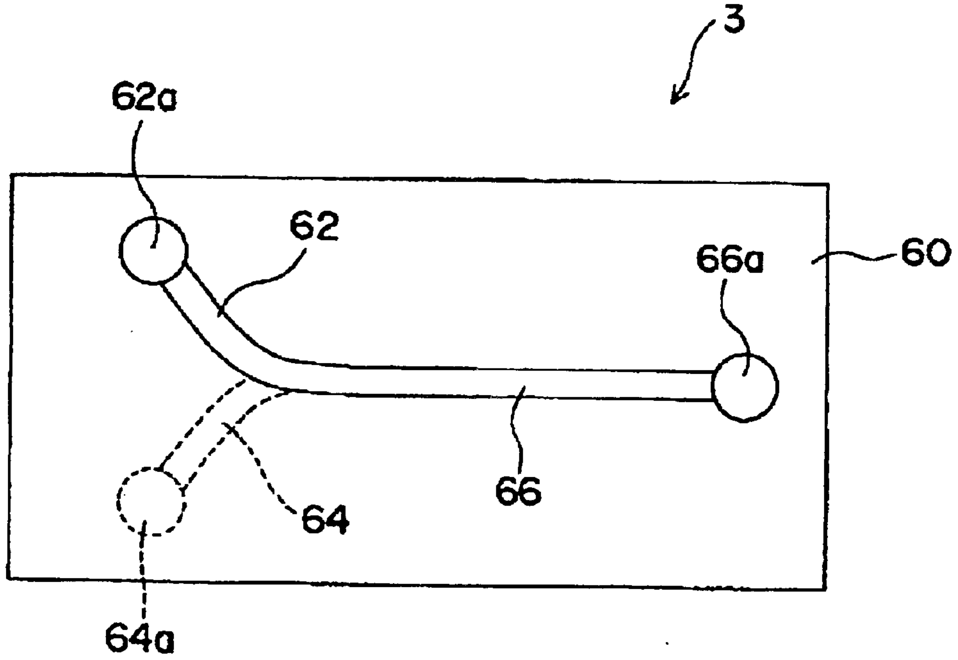

The microchip 3 can be formed by dividing the substrate 60 up and down at its center as shown in FIG. 11(*a*), for example, and jointing a portion including the flow pass sections 62 and 66 to a portion including the flow pass section 66. At this time, since a comparatively shallow groove is formed and the above portions may be jointed, the microchip 3 can be manufactured by molding of glass or plastic, so that a degree of freedom of the manufacturing is increased.

As shown by a dotted line in FIG. 11(*a*), for example, a section decreased portion 67 of which depth becomes smaller gradually is provided in the third flow pass section 66 similarly to the embodiment 1 so that the mixing can be carried out more efficiently.

In the above-explained embodiments, the diffuse mixing can be carried out in a microarea efficiently.

The present invention is not limited to the above-mentioned embodiments, and the present invention can be carried out in various forms.

For example, the microchips 2 and 3 are be used not only for blood coagulation but can be used widely as main components of a micromixer for mixing a very small amount of liquids.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

That which is claimed is:

1. A mixing structure comprising:

a first flow pass;

a second flow pass that is arranged on a level different from a level including the first flow pass;

a plurality of first branch flow passes and at least one second branch flow pass that are alternatingly and separately disposed at the level including the first flow pass and that extend in a direction which is substantially the same as that of the first flow pass, the first branch flow passes being connected to an end portion of the first flow pass, the at least one second branch flow pass being connected to the second flow pass; and a mixing flow pass that is connected to end portions of the first and second branch flow passes, with the at least one second branch flow pass being in a state wherein the first branch flow passes and the at least one second branch flow pass are disposed alternately;

wherein the mixing flow pass includes a section having a reduced flow pass cross-sectional area perpendicular to a flowing direction.

2. A mixing structure as claimed in claim 1, wherein a first liquid can flow from the first flow pass to the first branch flow passes, and a second liquid can flow from the second flow pass to the at least one second branch flow pass, so that the first and second liquids interflow in the mixing flow pass.

3. A mixing structure as claimed in claim 1, wherein connected portions between the first branch flow passes, the at least one second branch flow pass, and the mixing flow pass are overlapped.

4. A mixing structure as claimed in claim 1, wherein connected portions between the first branch flow passes, the at least one second branch flow pass, and the mixing flow pass are separated from each other.

5. A mixing structure as claimed in claim 1, wherein the first flow pass and the first branch flow passes, through which a first liquid flows, are formed on a plane, and wherein two or more other liquids can flow from upper and/or lower sides thereof so that the three or more liquids can interflow simultaneously.

6. A mixing structure as claimed in claim 1, wherein a valve section is provided on or in a vicinity of a connected portion of the second flow pass and the at least one second branch flow pass, and wherein the valve section has an enlarged flow pass cross-sectional area perpendicular to a flowing direction when viewed in the flowing direction from the second flow pass to the at least one second branch flow pass.

7. A mixing structure as claimed in claim 1, wherein each of the first and second branch flow passes has a dimension in an alternating direction of not more than 200 $\mu$m.

8. A mixing structure as claimed in claim 1, wherein a first one of the first and second branch flow passes is located at a center with respect to an alternating direction and has a dimension in the alternating direction that is wider than that of a second one of the first and second branch flow passes that is located outside with respect to the alternating direction.

9. A mixing structure as claimed in claim 1, wherein the first and second branch flow passes and the mixing flow pass extend in a substantially uniform direction at least in a vicinity of connected portions thereof.

10. A micromixer comprising a mixing structure as claimed in claim 1.

11. A microchip comprising a mixing structure as claimed in claim 1.

12. A mixing structure comprising:

a plurality of first branch flow passes formed in a layer form;

a plurality of second branch flow passes which are formed in a layer form on a plurality of layer levels which are different from layer levels including the first branch flow passes; and a mixing flow pass having an end portion connected to end portions of the first and second branch flow passes, wherein the mixing flow pass includes a section having a reduced flow pass cross-sectional area perpendicular to a flowing direction.

13. A mixing structure as claimed in claim 12, wherein the first and second branch flow passes and the mixing flow pass extend, at least in a vicinity of connected portions thereof, in a substantially uniform direction.

14. A micromixer comprising a mixing structure as claimed in claim 12.

15. A microchip comprising a mixing structure as claimed in claim 12.

16. A mixing method comprising:

a first step of branching a first liquid into plural layers so as to be substantially parallel with one another with intervals therebetween, and flowing the layers of the first liquid;

a second step of flowing a second liquid at a level which is different from a surface including a flow pass for the first liquid, and flowing the second liquid in a layer form between layers of the first liquid;

a third step of interflowing the layered first and second liquids in a laminar state; and a fourth step of making a flow pass dimension in a direction corresponding to a direction where the interflowed first and second liquids are layered to be smaller towards a lower stream side.

17. A mixing method as claimed in claim 16, wherein at least one of the first and second steps includes:

a flow stopping step of flowing the first or second liquid to a predetermined position before interflow and temporarily stopping the flow thereof; and a flow restarting step of flowing the stopped first or second liquid from the predetermined position at predetermined timing.

18. A mixing method as claimed in claim 16, wherein, in the third step, the layers of the first and second liquids are allowed to interflow in a state that a dimension of each of the layers in a layered direction is not more than 200 $\mu$m.

19. A mixing method as claimed in claim 16, wherein, in the first and second steps, the dimension of each layer of the first and second liquids in a layered direction is smaller at a center of the layered direction than at an outside.

20. A mixing method as claimed in claim 16, wherein, in the third step, the layers of the first and second liquids are flowed in a substantially uniform direction and are interflowed.

21. A mixing method as claimed in claim 16, wherein, in the third step, the layers of the first and second liquids are allowed to interflow at a flow rate which becomes substantially same as a flow rate after the interflow.

22. A mixing method comprising:

a first step of flowing a first liquid in a layer form;

a second step of flowing a second liquid in a layer form;

a third step of interflowing layered first and second liquids so that the layered first and second liquids overlap each other; and a fourth step of interflowing the layered first and second liquids through a flow pass including a section having a reduced flow pass cross-sectional area perpendicular to a flowing direction.

23. A mixing method as claimed in claim 22, wherein, in the third step, the layers of the first and second liquids are flowed in a substantially uniform direction and are allowed to interflow.

24. A mixing method as claimed in claim 22, wherein, in the third step, the layers of the first and second liquids are allowed to interflow at a flow rate which becomes substantially same as flow rate after the interflow.

25. A flow pass structure comprising:

a first flow pass provided at a first level of the flow pass structure;

a second flow pass provided at a second level of the flow pass structure, the second level being different from the first level;

a third flow pass having a plurality of sub flow passes separately layered and each having a first end and second end thereof, each sub flow pass being connected at the first end thereof to one of the first and second flow passes; and a fourth flow pass connected to the second ends of the sub flow passes, the fourth flow pass having a section with a reduced cross-sectional area perpendicular to a flowing direction.

26. A flow pass structure as claimed in claim 25, wherein a first liquid can flow from the first flow pass to the fourth flow pass via the third flow pass while a second liquid can flow from the second flow pass to the fourth flow pass via the third flow pass, and wherein the first and second liquids are mixed in the fourth flow pass.

27. A flow pass structure as claimed in claim 25, wherein a first liquid can flow from the fourth flow pass to the first flow pass via the third flow pass while a second liquid can flow from the fourth flow pass to the second flow pass via the third flow pass, and wherein the first and second liquids are separate from each other in the sub flow passes of the third flow pass.

28. A flow pass structure as claimed in claim 25, wherein the third and fourth flow passes are provided at the first level.

29. A flow pass structure as claimed in claim 25, wherein, in the second level, one end of the second flow pass is provided at a position where first ends of the sub flow passes are provided in the first level.

* * * * *